(12) United States Patent
Krause

(10) Patent No.: US 6,313,655 B1
(45) Date of Patent: Nov. 6, 2001

(54) SEMICONDUCTOR COMPONENT AND METHOD FOR TESTING AND OPERATING A SEMICONDUCTOR COMPONENT

(75) Inventor: Gunnar Krause, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/133,893

(22) Filed: Aug. 14, 1998

(30) Foreign Application Priority Data

Aug. 14, 1997 (DE) ............................................. 197 35 406

(51) Int. Cl.[7] .................................................. G01R 31/02
(52) U.S. Cl. ....................... 324/763; 324/765; 324/158.1
(58) Field of Search ................................... 324/763, 760, 324/765, 73.1, 158.1

(56) References Cited

U.S. PATENT DOCUMENTS

| | | | |
|---|---|---|---|
| 4,336,495 | * 6/1982 | Hapke | 324/765 |
| 5,212,442 | * 5/1993 | O'Toole et al. | 324/765 |
| 5,475,646 | 12/1995 | Ogihara . | |
| 5,589,766 | * 12/1996 | Frank et al. | 324/158.1 |
| 5,898,700 | * 4/1999 | Kim | 371/21.1 |
| 5,994,915 | * 11/1999 | Farnworth et al. | 324/765 |
| 6,037,762 | * 3/2000 | McClire | 324/760 |

FOREIGN PATENT DOCUMENTS 0 574 002 A2   12/1993  (EP) .

OTHER PUBLICATIONS

International Patent Application WO 97/25674 (Gilliam et al.) dated Jul. 17, 1997.
Japanese Patent Abstract No 4–296038 (A) (Ishii), dated Oct. 20, 1992.

* cited by examiner

Primary Examiner—Safet Metjahic
Assistant Examiner—T. R. Sundaram
(74) Attorney, Agent, or Firm—Herbert L. Lerner; Laurence A. Greenberg; Werner H. Stemer

(57) ABSTRACT

The semiconductor component has an electronic circuit in or on a main surface of a semiconductor chip. Connecting surfaces or pads are disposed on the main surface of the semiconductor chip and are electrically coupled to the electronic circuit. This allows electrical access to the circuit from outside the chip. The electronic circuit is operable in a test mode, which can normally be carried out in the wafer composite of the semiconductor chips and in which an externally supplied test signal is applied to a predetermined pad, and in an operating mode in which operating signals are applied to the pads. At least one pad is assigned a switching device which allows changing the function of that pad from the test mode to the operating mode.

17 Claims, 2 Drawing Sheets

SEMICONDUCTOR COMPONENT AND METHOD FOR TESTING AND OPERATING A SEMICONDUCTOR COMPONENT

BACKGROUND OF THE INVENTION

Field of the Invention

The invention relates to a semiconductor component and a method for testing and operating a semiconductor component, which has an electronic circuit which is formed on a main surface of a semiconductor chip, and has connecting surfaces ("pads"), which are arranged on the main surface of the semiconductor chip and are electrically coupled to the electronic circuit, for electrical communication between the circuit and the outside world, the electronic circuit on the one hand being operable in a test mode, which can normally be carried out in the wafer composite of the semiconductor chips and in which an externally supplied test signal is applied to a predetermined pad, and on the other hand being operable in an operating mode in which operating signals are applied to the pads and/or to terminal pins which are electrically coupled to the pads and are connected to the outside of the component.

As an example of such a semiconductor component, a synchronous dynamic semiconductor memory (SDRAM) has become known, for example, from Y. Takai et al., "250 Mbyte/s Synchronous DPAM Using a 3-Stage-Pipeline Architecture," IEEE Journal of Solid-State Circuits, Vol. 29, April 1994, p. 526; Yuno Choy et al., "16-Mb Synchronous DRAM with 125-Mbyte/s Data Rate," IEEE Journal of Solid-State Circuits, Vol. 29, April 1994, p. 529. According to JEDEC Standard No. 21-C, such SDRAM semiconductor memories are available in so-called TSOP-2 housings with, typically, 50 external terminal pins (1 M×16 SDRAM, 1 M×18 SDRAM, 256 k×16 SDRAM) or 54 terminal pins (16 M×4 SDRAM, 8 M×8 SDRAM, 4 M×16 SDRAM). Metallic pads are formed predominantly in an edge region on the main surface of the semiconductor chip. The pads are used for electrical communication between the circuit components that are formed on the semiconductor chip and the outside world, and typically have a square shape with dimensions of several $\mu m \times \mu m$. During installation in the semiconductor component housing, some of these pads are connected, for example via bonding wires, to the terminal pins which project to the exterior. After installation of the semiconductor component in the housing, a relatively small number of the pads are no longer accessible from the exterior. They are required only in the test mode, in which the semiconductor chips, not yet in their housing, are still in the wafer composite.

FIG. 2 shows schematically those components of a conventional synchronous dynamic semiconductor memory SDRAM which are required to explain the problem on which the invention is based. The illustration shows the pads 1 and 2 which are assigned to the two DQM terminals LDQM (lower input mask/output enable) and UDQM (upper input mask/output enable) of the SDRAM. The pads are metallic pads, essentially having a square shape. They are disposed on the main surface of the semiconductor chip and are electrically connected via lines 3, 4 and via drivers 5, 6 to the control and logic circuit arranged in the semiconductor chip (indicated in FIG. 2 by the designations LDQM internal and UDQM internal). Furthermore, a test pad 7 is provided, which is required for test purposes, and to which a test activation signal EXTADDR is applied externally in the test mode. The actual test mode sequences in the form of so-called IPL codes (which are used, inter alia, to test to a greater extent the functionality of the redundant and non-redundant bit lines when the word line and the like are open of the semiconductor memory which is still located in the wafer composite, that is to say has not yet been canned) are supplied from a control circuit 9 in the form of a signal TMEXTADDR. The signal TMEXTADDR is applied to one input of an AND gate 10, at whose output a signal Ax is output. The output signal Ax is used to test the relevant circuit parts. The test mode is activated by the test activation signal EXTADDR which is applied externally to the test pad 7, is applied via a driver 8 to the second input of the AND gate 10, and controls the control circuit 9, and thus the emitted test mode sequences, in the sense of switching them on and off. The metallic test pad 7 which is formed on the main surface of the semiconductor chip is thus required only for test purposes, and is actually no longer required subsequently.

SUMMARY OF THE INVENTION

It is accordingly an object of the invention to provide a semiconductor component (in particular, a synchronous dynamic semiconductor memory of the random access type) and a method of testing and operating a semiconductor component, which overcomes the above-mentioned disadvantages of the prior art devices and methods of this general type wherein it is possible to do away with test pads that are required only for test purposes but occupy valuable chip area.

With the foregoing and other objects in view there is provided, in accordance with the invention, a semiconductor component, comprising:

a semiconductor chip having a main surface and a plurality of terminal pins;

an electronic circuit formed in or on the main surface of the semiconductor chip and connected to the terminal pins;

connecting surfaces disposed on the main surface of the semiconductor chip and electrically connected to the electronic circuit for electrically communicating with the electronic circuit from outside the semiconductor chip;

the electronic circuit being operable in a test mode, in which an external test signal is applied to a predetermined one of the connecting surfaces, and in an operating mode, in which operating signals are applied to one of the connecting surfaces and the terminal pins coupled to the connecting surfaces; and a switching device connected to at least one of the connecting surfaces, the switching device switching a function of the at least one connecting surface from the test mode to the operating mode.

In accordance with an added feature of the invention, the switching device is hard-wired on the main surface of the semiconductor chip.

In accordance with an additional feature of the invention, the switching device irreversibly switches the at least one connecting surface to the operating mode.

In accordance with another feature of the invention, the semiconductor component includes a data input/output, and the at least one connecting surface is assigned to the data input/output.

In accordance with a further feature of the invention, the switching device is connected to and switched by a control signal originating from a control circuit.

In accordance with again an added feature of the invention, the semiconductor component is a synchronous, dynamic semiconductor memory component of random access type, and wherein the connecting surfaces are an LDQM and a UDQM pad, respectively, and wherein the switching device functionally changes one of the LDQM and UDQM pads to a test mode.

In accordance with again an additional feature of the invention, the one LDQM pad and UDQM pad is switched by the switching device as an "Extended Address Bit" in the test mode.

With the above and other objects in view there is also provided, in accordance with the invention, a method of testing and operating the semiconductor component, wherein the semiconductor component has an electronic circuit which is formed in or on a main surface of a semiconductor chip, connecting surfaces disposed on the main surface of the semiconductor chip and electrically connected to the electronic circuit, for external electrical access to the electronic circuit, and terminal pins electrically connected to the connecting surfaces and connected to an exterior of the component, the method which comprises:

selectively operating the electronic circuit in a test mode, in which an external test signal is applied to a predetermined connecting surface, and in an operating mode, in which operating signals are applied to at least one of the connecting surfaces and the terminal pins of the component; and connecting a switching device to at least one pad whereby it is possible to change a function of the pad from the test mode to the operating mode.

In accordance with a concomitant feature of the invention, the electronic circuit is operated in the test mode while the semiconductor chip is still in a wafer composite.

In other words, at least one of the pads is assigned a switching device, by means of which it is possible to change the function of this pad from the test mode to the operating mode. The invention makes it possible to do away with one test, pad that is required only for test purposes. The space which is additionally required on the main surface of the semiconductor chip for changing the switching device, which is needed for the relevant pad, into the subsequent operating mode is, as a rule, considerably smaller than the space required for a pad which is used for the macroscopically accessible connection of the semiconductor circuit to the outside world. This applies even to a switching device of comparatively complex design with a plurality of transistors. In its simplest configuration, the switching device can be hard-wired on the main surface of the semiconductor chip. Since, as a rule, the switching device is required only for test purposes, it is furthermore possible to provide for the switching device irreversibly to switch to the operating mode that pad which is coupled to it. For this purpose, the switching device may, for example, be coupled to one or several fuses, which are burnt out (i.e., the switching device is deactivated), once all the tests have been carried out.

In a preferred implementation, the switching device is a multiplexer that is relatively simple in circuitry terms. In the multiplexing circuit, an address word, which is preferably in dual code, is applied to switch through in each case one of N signal inputs or input channels, respectively, to the output or output channel, respectively. The signal path between the input and output of the multiplex circuit can furthermore be interrupted by a disconnect signal.

In a particularly preferred embodiment of the invention, the at least one pad which is coupled to the switching device is assigned to a data input or output of the semiconductor component. The best mode semiconductor component is a synchronous dynamic semiconductor memory component of the random access type (SDRAM), in which the function of at least one of the LDQM or UDQM pads can be changed from the test mode to the operating mode by means of the switching device. In particular, the semiconductor component is represented by an SDRAM in an x16 configuration, in which two DQM pads are available for in each case one group of 8 data inputs and outputs, respectively, DQ0, DQ1, . . . , DQ7. In the test mode, the switching device is used, for example, to change the UDQM pad (which is coupled to the switching device) for the DQM connection (input mask/output enable) to the test mode for all data inputs and outputs DQs and to switch the LDQM pad (which is likewise coupled to the switching device) as an extended address bit. The invention makes it possible to save a characterization pad, with full flexibility in terms of carrying out all the test mode sequences that are normal for an SDRAM.

Other features which are considered as characteristic for the invention are set forth in the appended claims.

Although the invention is illustrated and described herein as embodied in a semiconductor component—particularly a random access synchronous dynamic semiconductor memory—and a method of testing and operating such a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
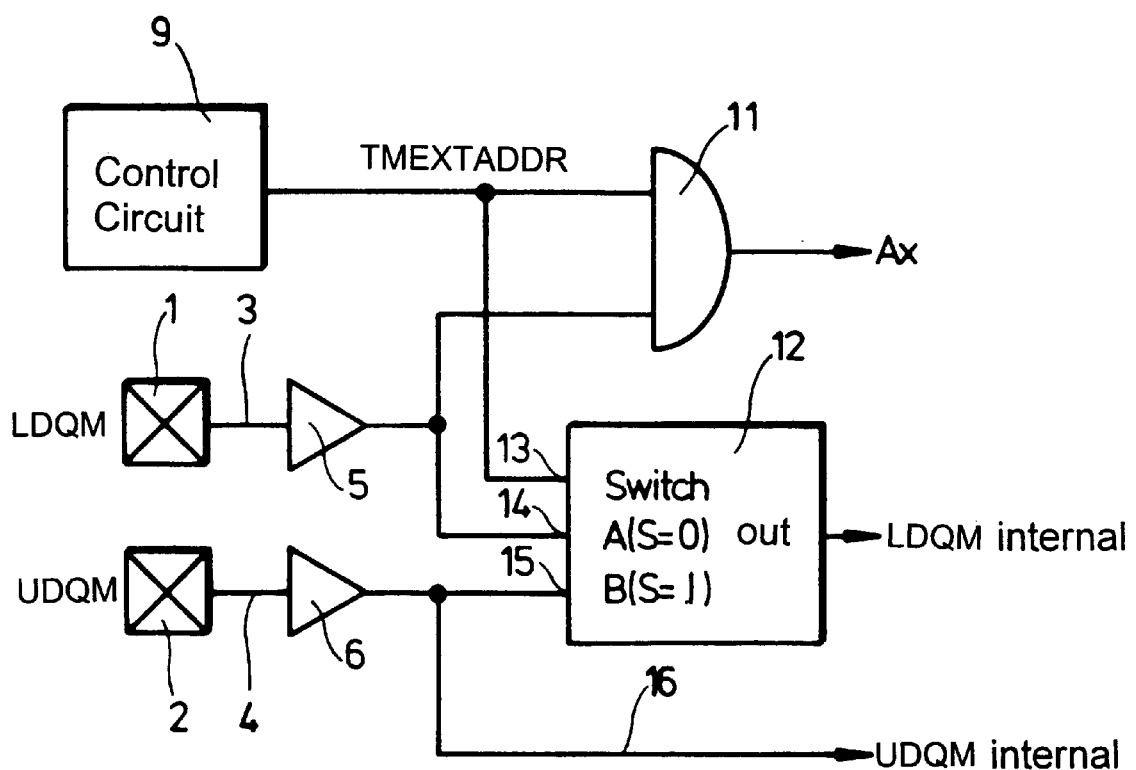
FIG. 1 is a schematic partial diagram of a synchronous dynamic semiconductor memory SDRAM according to the invention.
Figure 2:
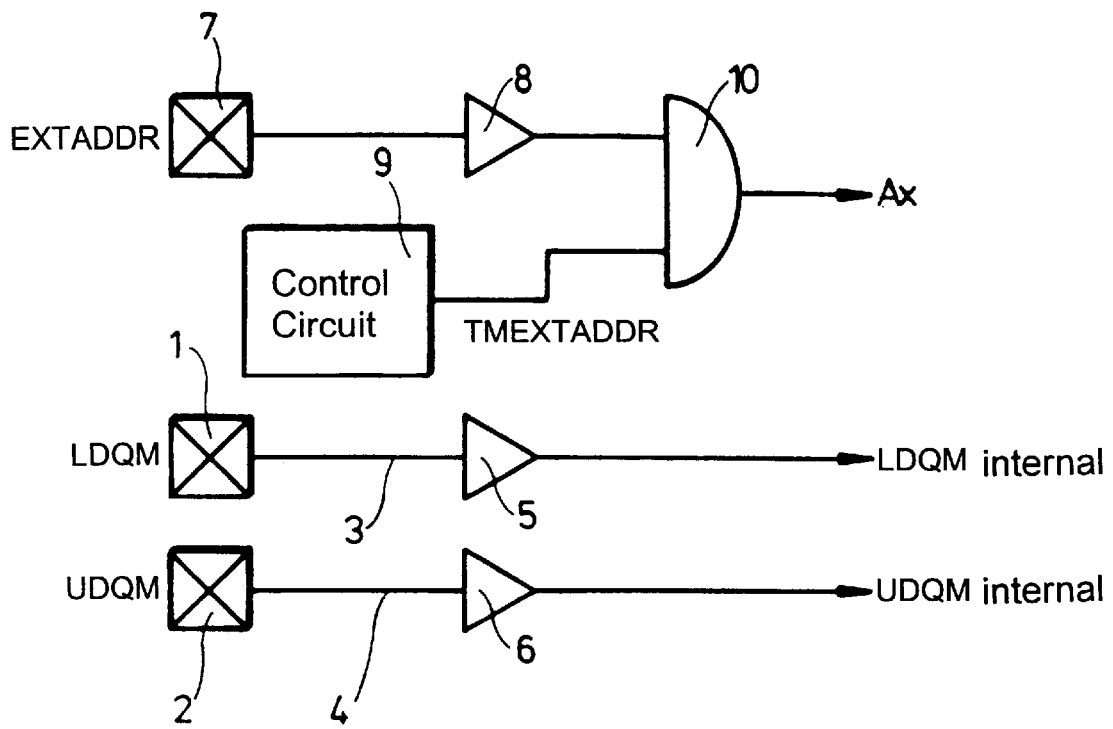
FIG. 2 is a similar detail of an prior art semiconductor memory.

The illustration of the exemplary embodiment of the novel semiconductor memory uses the same reference symbols as FIG. 2 and, accordingly, the above description of the basic components will not be repeated. In contrast to the configuration according to FIG. 2 and corresponding to the concept of the invention, FIG. 1 has a switching device 12 in the form of a 2:1 multiplex circuit with an enable input 13. The test sequences output by the control circuit 9 are applied to the enable input 13 in the form of the signal TMEX-TADDR (these are passed on at the output of the AND gate 11 as the signals Ax). The inputs 14 and 15 of the multiplexer 12 receive the signals LDQM and UDQM, respectively. The output of the multiplexer 12 supplies the signal LDQM internal, while the signal UDQM internal is passed on directly via the line 16. The switching device 12 produces the following level table, the symbols representing the logic switching states ZERO and ONE:

| INPUT | | | OUTPUT | | |
|---|---|---|---|---|---|
| | | | LDQM | UDQM | |
| TMEXTADDR | LDQM | UDQM | internal | internal | Ax |
| 0 | 0 | 0 | 0 | 0 | 0 |
| 0 | 0 | 1 | 0 | 1 | 0 |
| 0 | 1 | 0 | 1 | 0 | 0 |
| 0 | 1 | 1 | 1 | 1 | 0 |
| 1 | 0 | 0 | 0 | 0 | 0 |
| 1 | 0 | 1 | 1 | 1 | 0 |
| 1 | 1 | 0 | 0 | 0 | 1 |
| 1 | 1 | 1 | 1 | 1 | 1 |

The signal Ax is ZERO (0) in the case of standard activation or standard selection of non-redundant and fused elements in the circuit, and is ONE (1) in the case of activation or selection of redundant elements. It can furthermore be seen that the signal UDQM in the test mode becomes the signal DQM for all the data input and output connections DQ of the semiconductor memory and that, in this case, the signal LDQM is switched as an extended address bit. The exemplary embodiment relates to an SDRAM in a ×16 configuration, in which the two DQM pads 1 and 2 are available for in each case one group of 8 DQ connections. However, the invention is also suitable for other configurations, for example ×4 configuration or ×8 configuration.

The invention allows a fully flexible test capability for memory cells, including redundant word and bit lines, without any additional test pad being required for the information as to whether the intention is to address a redundant or a non-redundant element.

I claim:

1. A semiconductor component, comprising:

a semiconductor chip having a main surface and a plurality of pads, said pads not being solely for testing;

an electronic circuit formed in or on said main surface of said semiconductor chip and electrically connected to said pads;

said electronic circuit being operable in a test mode, in which an external test signal is applied to a predetermined one of said pads, and in an operating mode, in which operating signals are applied to one of said pads; and a switching device connected to at least one of said pads, said switching device switching a function of at least one of said pads from the test mode to the operating mode, said switching device having inputs and an output, one of said inputs not connecting-through, said switching device switching a signal applied to one of said inputs in the test mode from one of said pads controlled by a test mode signal, to said output and switching a signal applied on a further one of said inputs by a further pad in the operation mode to said input not connecting-through in the test mode but guided to the electronic circuit as a test signal for testing relevant circuit parts.

2. The semiconductor component according to claim 1, wherein said switching device is hard-wired on the main surface of said semiconductor chip.

3. The semiconductor component according to claim 1, wherein said switching device irreversibly switches said at least one connecting surface to the operating mode.

4. The semiconductor component according to claim 1, wherein the semiconductor component includes a data input/output, and said at least one connecting surface is assigned to said data input/output.

5. The semiconductor component according to claim 1, wherein said switching device is connected to and switched by a control signal originating from a control circuit.

6. The semiconductor component according to claim 1, wherein the semiconductor component is a synchronous, dynamic semiconductor memory component of random access type, and wherein said connecting surfaces are an LDQM and a UDQM pad, respectively, and wherein said switching device functionally changes one of said LDQM and UDQM pads to a test mode.

7. The semiconductor component according to claim 6, wherein said one LDQM pad and UDQM pad is switched by said switching device as an "Extended Address Bit" in the test mode.

8. A method of testing and operating a semiconductor component, wherein the semiconductor component has an electronic circuit which is formed in or on a main surface of a semiconductor chip, pads disposed on the main surface of the semiconductor chip and electrically connected to the electronic circuit, for external electrical access to the electronic circuit, the pads not being solely for testing, the method which comprises:

selectively operating the electronic circuit in a test mode, in which an external test signal is applied to a predetermined pad, and in an operating mode, in which operating signals are applied to at least one of the pads of the component; and connecting a switching device to at least one of the pads for switching a function of at least one of the pads from the test mode to the operating mode, the switching device having inputs and an output, one of the inputs not connecting-through, the switching device switching a signal applied to one of the inputs in the test mode from one of the pads controlled by a test mode signal, to the output and switching a signal applied on a further one of the inputs by a further pad in the operation mode to the input not connecting-through in the test mode but guided to the electronic circuit as a test signal for testing relevant circuit parts.

9. The method according to claim 8, wherein the electronic circuit is operated in the test mode while the semiconductor chip is still in a wafer composite.

10. The method according to claim 8, wherein the connecting step comprises providing a switching device which is hardwired on the main surface of the semiconductor chip.

11. The method according to claim 8, which comprises irreversibly switching the at least one connecting surface to the operating mode with the switching device.

12. The method according to claim 8, which comprises assigning the at least one connecting surface to a data input or output of the semiconductor component.

13. The method according to claim 8, which comprises switching the switching device with a control signal from a control circuit.

14. The method according to claim 8, wherein the semiconductor component is a synchronous, dynamic semiconductor memory component of the random access type and the connecting surfaces are an LDQM pad and a UDQM pad, and wherein the operating step comprises changing a function of at least one of the LDQM and UDQM pads to the test mode with the switching device.

15. The method according to claim 14, which comprises switching the LDQM pad or UDQM pad that is connected to the switching device as an "Extended Address Bit" in the test mode.

16. The semiconductor component according to claim 1, wherein said switching device is a multiplexer switching device.

17. The method according to claim 8, wherein the connecting step comprises providing a multiplexer switching device as the switching device.

* * * * *